United States Patent
Radetinac et al.

(10) Patent No.: US 11,120,946 B2
(45) Date of Patent: Sep. 14, 2021

(54) MICRO-ELECTRONIC ELECTRODE ASSEMBLY

(71) Applicant: TECHNISCHE UNIVERSITÄT DARMSTADT, Darmstadt (DE)

(72) Inventors: Aldin Radetinac, Griesheim (DE); Arzhang Mani, Frankfurt am Main (DE); Philipp Komissinskiy, Groß-Zimmern (DE); Lambert Alff, Darmstad (DE); Mohammad Nikfalazar, Darmstadt (DE)

(73) Assignee: TECHNISCHE UNIVERSITÄT DARMSTADT, Darmstadt (DE)

( * ) Notice: Subject to any disclaimer, the term of this patent is extended or adjusted under 35 U.S.C. 154(b) by 0 days.

(21) Appl. No.: 16/077,064

(22) PCT Filed: Jan. 27, 2017

(86) PCT No.: PCT/EP2017/051837
§ 371 (c)(1),
(2) Date: Aug. 26, 2018

(87) PCT Pub. No.: WO2017/137269
PCT Pub. Date: Aug. 17, 2017

(65) Prior Publication Data
US 2019/0237265 A1    Aug. 1, 2019

(30) Foreign Application Priority Data

Feb. 12, 2016 (DE) .................... 10 2016 102 501.1

(51) Int. Cl.
*H01L 21/00* (2006.01)
*H01G 7/06* (2006.01)
(Continued)

(52) U.S. Cl.
CPC .............. *H01G 7/06* (2013.01); *H01G 4/008* (2013.01); *H01G 4/33* (2013.01); *H01L 28/57* (2013.01); *H01L 28/75* (2013.01); *H01G 4/1227* (2013.01)

(58) Field of Classification Search
CPC . H01G 7/06; H01G 4/008; H01G 4/33; H01L 28/57; H01L 28/75
See application file for complete search history.

(56) References Cited

U.S. PATENT DOCUMENTS

| | | | |
|---|---|---|---|
| 2004/0109280 A1* | 6/2004 | Moon | H01L 28/56 361/306.3 |
| 2015/0228408 A1 | 8/2015 | Koutsaroff et al. | |

FOREIGN PATENT DOCUMENTS

| | | |
|---|---|---|
| EP | 1675162 A2 | 6/2006 |
| EP | 2784041 A1 | 10/2014 |

OTHER PUBLICATIONS

International Search Report (dated May 10, 2017) for corresponding International App. PCT/EP2017/051837.

* cited by examiner

*Primary Examiner* — Richard A Booth
(74) *Attorney, Agent, or Firm* — WRB-IP LLP

(57) ABSTRACT

A micro-electronic electrode assembly having a first electrode arranged on a substrate is provided, wherein the first electrode has a thin layer made of a first electrode material having a solid state lattice, wherein the first electrode material oxidizes upon contact with oxygen-containing compounds and has a perovskite or perovskite-derived crystal structure, and wherein the electrode has a functional surface facing away from the substrate, a separation layer is arranged on the functional surface of the electrode, which prevents an oxidation of the electrode material in the region of the functional surface, the oxidation changing the prop- (Continued)

erties of the electrode. An electrically insulating functional layer is arranged on the separation layer and a second electrode is arranged on the electrically insulating functional layer. According to the invention, advantageously the first electrode material has one of the compounds SrMoO3, SrMoO3-aNa BaMoO3, SrVO3, Of Sr2MoO4, and the separation layer has one of the compounds SeTiO3, DyScO3, GdScO3 or SrHfO3. The functional layer is a compound with the molecular formula BaxSr1−xTi1±yO3±z, preferably Ba0.5Sr0.5TiO3. The electrode assembly forms a varactor.

12 Claims, 1 Drawing Sheet

(51) Int. Cl.
| | | |
|---|---|---|
| *H01L 49/02* | (2006.01) | |
| *H01G 4/33* | (2006.01) | |
| *H01G 4/008* | (2006.01) | |
| *H01G 4/12* | (2006.01) | |

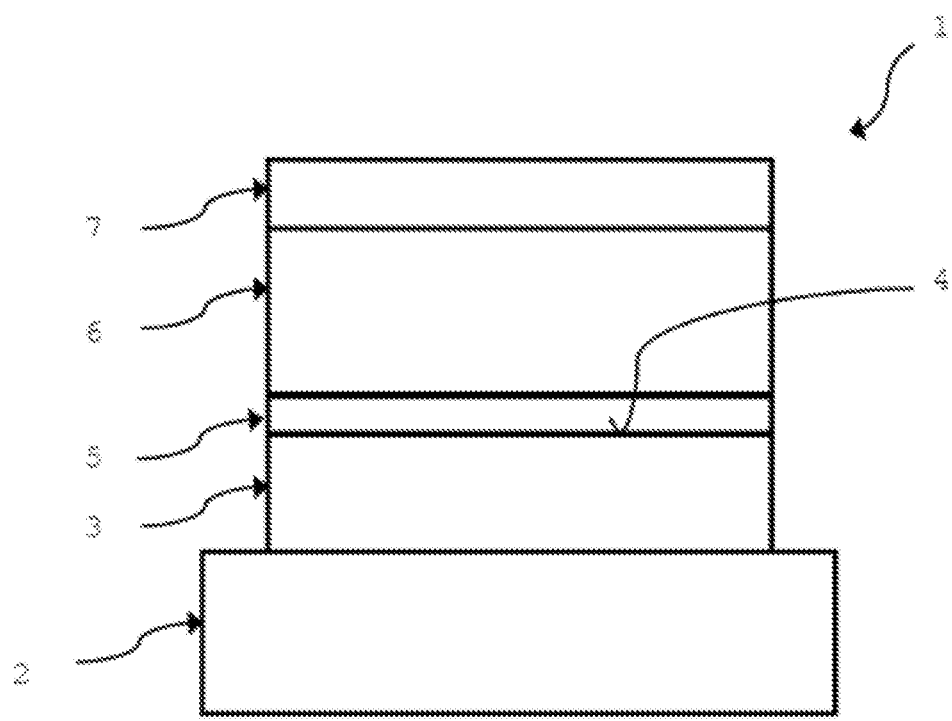

MICRO-ELECTRONIC ELECTRODE ASSEMBLY

BACKGROUND AND SUMMARY

The invention relates to a microelectronic electrode assembly having an electrode arranged on a substrate, wherein the electrode comprises a thin electrode layer composed of a first electrode material.

Electrode assemblies of this type are known from practice in a wide variety of configurations. Depending on the desired functionality or use, numerous semiconductor components with different properties have been developed, which can consist or be composed of various materials. As a rule, the electrode here should have the highest possible electrical conductivity, should take up little space and should be able to be joined inexpensively and reliably to further layers or microelectronic components.

To produce a capacitor or a varactor using an electrode assembly of this type, the electrode layer can consist of e.g. a platinum layer on which a functional layer composed of a suitable dielectric material is deposited, the dielectric properties of which can be influenced and modified during operation. On this functional layer, a further, second electrode is arranged in turn, which can likewise consist of platinum. A capacitor of this type can be produced inexpensively using conventional production methods. As a result of the polycrystalline structure of the functional layer, defects and grain boundaries, which have a negative effect on the functionality of the functional layer, are inevitably formed at the interfaces and in the interior of the functional layer. The functional layer must generally be thick enough, therefore, to allow reliable functioning and thus reliable operation of the capacitor or varactor. Increasing layer thicknesses of the functional layer are often associated with rising production costs and less favorable functional properties, such as e,g, switching times and energy efficiency.

It is desirable to provide an electrode assembly of the type mentioned above in which a functional layer having advantageous properties can be arranged on the electrode layer composed of the electrode material and can be reliably joined to the electrode layer composed of the electrode material.

According to an aspect of the invention an electrode assembly having an, electrode layer composed of a first electrode material is provided, wherein the electrode material oxidizes upon contact with oxygen-containing compounds and comprises a solid-state lattice with a perovskite or perovskite-derived crystal structure, and wherein the electrode comprises a functional surface facing away from the substrate, on which functional surface a further layer can be arranged, and having a separation layer composed of a separation-layer material which covers the functional surface of the electrode, wherein the separation layer prevents an oxidation of the electrode material in the region of the functional surface, which oxidation would modify the properties of the electrode. Investigations have shown that an electrode material of this kind has particularly advantageous properties for an electrode assembly. The electrode material exhibits very high conductivity and very low surface roughness. As a result of the perovskite or perovskite-derived crystal lattice structure, the formation of a comparable crystal lattice structure is promoted in a functional layer arranged thereon. It is possible to produce both the layer composed of the first electrode material and the separation layer as well as a functional layer which is arranged thereon using conventional epitaxial methods. Preferably in this case, the electrode material and the separation-layer material as well as the respective layer thicknesses are predetermined in such a way that the separation layer can be arranged or deposited on the electrode layer in a lattice-matched manner so that a spatial lattice structure of the separation layer is predetermined by a spatial lattice structure of the electrode layer.

Since the electrode materials currently identified as particularly suitable oxidize very rapidly upon contact with oxygen-containing compounds and the composition and properties of the electrode layer would thus be modified starting from an outer layer, so that the advantageous properties for the electrode would be negatively affected and its proper functioning put at risk, a separation layer is provided which covers the functional surface of the electrode and by means of which an oxidation of the electrode material in the region of the functional surface is prevented, which oxidation would modify the properties of the electrode. The separation layer can be very thin, with a thickness of only a few nanometers. Furthermore, the separation layer can comprise a suitable crystal lattice structure to allow the formation of a functional layer arranged thereon which likewise has a suitable crystal lattice structure and which can be produced by an epitaxial method. The suitable electrode materials generally oxidize immediately upon contact with air as well as upon contact with other materials or coatings comprising oxygen-containing compounds, and so after the functional surface of the electrode has been covered with the separation layer, the as yet unfinished electrode assembly can be stored and processed without any special measures, such as e.g. a vacuum. This makes it significantly simpler to produce an electrode assembly according to the invention, enabling noticeable cost savings to be achieved.

It is preferably provided that an electrically insulating functional layer is arranged on the separation layer and that a second electrode is arranged on the electrically insulating functional layer. In this way, for example capacitors or varactors can be produced with a very low thickness of the respective layer construction together with very advantageous properties for their operation. The functional layer can have virtually any electrical or magnetic properties in order to allow different properties and functions to be obtained, according to the requirements and intended use of the electrode assembly. Furthermore, since the individual layers can be made very thin, only a small quantity of the respective material is needed for the individual layers and so rapid and inexpensive production of the individual material layers and of the overall microelectronic part or microelectronic electrode assembly is promoted.

It has been shown that, according to the invention, a varactor with advantageous properties can be produced if the electrically insulating functional layer has modifiable dielectric properties. In contrast to known and conventionally produced varactors, varactors with a very thin functional layer composed of a particularly suitable dielectric material are possible with the configuration of the electrode assembly according to the invention.

The production and advantageous configuration of the functional layer are promoted inter alia by the fact that the separation layer has a separation-layer solid-state lattice and the functional layer has a functional-layer solid-state lattice, wherein a lattice structure of the separation-layer solid-state lattice is matched to a lattice structure of the functional-layer solid-state lattice such that the functional layer can be deposited epitaxially on the separation layer. In the same way, the separation-layer solid-state lattice can be matched to a lattice structure of the electrode layer composed of the electrode material such that the separation layer can be deposited epitaxially on the electrode layer and the resulting lattice structure of the separation layer is matched to the lattice structure of the electrode layer or is predetermined by the lattice structure of the electrode layer.

According to an embodiment of the inventive concept, it is provided that the first electrode material is a perovskite oxide, a perovskite oxynitride or a perovskite-based Ruddlesden-Popper structure. It has been shown that an electrode material of this type has particularly advantageous properties and has, inter alia, high electrical conductivity even in particularly low layer thicknesses. Apart from perovskite oxides or oxynitrides, other materials having a perovskite-based Ruddlesden-Popper structure can also be used, by means of which comparable advantageous properties for the electrode material are predetermined. A perovskite-based Ruddlesden-Popper structure according to the invention comprises a multi-layer construction of layers having a perovskite structure alternating with layers having a sodium, chloride structure.

It is preferably provided that the first electrode material is a compound with the empirical formula $A1 \pm xB1 \pm yO3 \pm z$ or $A1+nBn(O1-aNa)3n+1$, wherein A is one of the elements Ca, Sr or Ba or a mixture of these elements, wherein B is one of the elements V, Nb, Ta, Cr, Mo or V or a mixture of these elements and wherein the numerals x, y, z and a can each assume values of between 0 and 1 and the numeral n can assume values of between 1 and $\infty$.

An electrode material according to the invention with a Ruddlesden-Popper structure can comprise a compound with the empirical formula $An+1BO3n+1$, wherein A can be one of the elements referred to above as A and B can be one of the elements referred to above as B and wherein the index n also refers to the number of perovskite layers in the Ruddlesden-Popper structure. An electrode material of this type, which is not a perovskite oxide or ox nitride but only has a perovskite-based Ruddlesden-Popper structure, can likewise be used to produce an electrode assembly according to the invention and has comparable advantageous properties given a suitable material selection.

It is particularly preferably provided that the first electrode material comprises one of the compounds $SrMoO3$, $SrMoO3-aNa$ $BaMoO3SrVO3$, $SrNbO3$ or $Sr2MoO4$. The above-mentioned electrode materials not only have good properties for use as an electrode on a substrate but also promote the formation and adhesion of a functional layer composed of advantageous dielectric materials and having advantageous properties.

According to an advantageous embodiment of the inventive concept, it is provided that the electrode material has a resistivity of less than 100 $\mu\Omega m$ and preferably less than 30 $\mu\Omega m$, An electrical conductor material is generally considered to be a material with a resistivity of less than 1000 $\mu\Omega m$. In comparison, the preferred electrode material according, to the invention has significantly lower resistivity. An electrode material with such a low resistivity permits high electrical conductivity of the electrode material and an advantageous electrical connection of the electrode assembly to further electrical components, such as e.g. a power supply, for the electrode.

According to the invention, it is provided that the separation layer is a perovskite oxide and comprises a compound with the empirical formula $A1 \pm xB1 \pm yO3 \pm z$, wherein either A is one of the elements Ca, Sr or Ba or a mixture of these elements and B is one of the elements Ti, Zr or Hf or a mixture of these elements, or wherein A is one of the elements La, Pr, Dy, Tb, Sm, Nd or Gd or a mixture of these elements and B is one of the elements Sc or Y or a mixture of these elements, and wherein the numerals x, y and z can each assume values of between 0 and 1.

According to a particularly advantageous embodiment of the inventive concept, it is provided that the separation layer comprises one of the compounds $SrTiO3$, $SrZrO3$, $DyScO3$, $GdScO3$ or $SrHfO3$, It has been shown that, by using compounds of this type, separation layers with a very low layer thickness of a few nanometers can be sufficient to prevent an undesirable reaction of the layer composed of the first electrode material with oxygen or oxygen compounds from the environment or from the functional layer arranged thereon. Thus, for example, a separation layer composed of $SrTiO3$ with a thickness of only five or about five crystal lattice units or of a few nanometers is sufficient to protect the first electrode material. At the same time, the separation layer has a crystal lattice structure which is matched to both the crystal lattice structure of the first electrode material and the crystal lattice structures of suitable functional layers and promotes or allows advantageous combinations of a first electrode material and a functional material.

The use of metal oxides, and in particular metal, oxides with molybdenum, to produce the first electrode on the substrate results in particularly advantageous properties. Thus, for example, a metal oxide with molybdenum in oxidation state 6 as a substrate material can be combined with a metal oxide with molybdenum in oxidation state 4 as a first electrode material. The substrate material has a very electrically insulating effect while the first electrode material has very high electrical conductivity. The crystal lattice structures are matched to one another.

For the use of the electrode assembly according to the invention as a capacitor or varactor, it is particularly advantageous for the functional layer to be a compound with the empirical formula $BaxSr1-xTi1 \pm yO3 \pm z$, e.g. $Ba0.5Sr0.5TiO3$, wherein the numerals x, y and z can each assume values of between 0 and 1.

The electrode assembly according to the invention can have particularly advantageous properties in conjunction with further electrical components and as a functional electrical element if a work function of the electrode material and/or an electron affinity of the separation, layer material show(s) a difference which is as great as possible, in particular a difference of more than 1 eV, relative to an electron affinity of a functional material of the functional layer. As a result of the potential difference according to the invention between the electrode and the functional layer, in the case of small electrical voltage drops or electrical fields in particular, an electron barrier can be created, promoting correspondingly low leakage currents. A difference that is as great as possible, e.g. of 0.5 eV or 1 eV, in a transitional region from the electrode to the functional layer leads to the creation of a depletion zone for electrically charged particles, which can contribute to a reduction in undesirable leakage currents when the electrode assembly according to the invention is used in an electrical part.

If the work function of the electrode material already shows a sufficiently great difference relative to the electron affinity of the functional material, the material selected as the separation-layer material can be a material with an electron affinity that corresponds at least approximately to the electron affinity of the functional material in order to support an effective electron barrier. However, if the work function of the electrode material approximately corresponds to the electron affinity of the functional material and therefore no effective electron barrier would initially be obtained, the selection of a suitable separation-layer material with an electron affinity differing significantly from the work function of the electrode material and from the electron affinity of the functional material can lead to the creation of an electron barrier, e.g. in order to reduce leakage currents.

According to the invention, it is provided that the electrode assembly forms a varactor. Using the above-mentioned materials, it is possible to produce a varactor with particularly advantageous properties, such as e.g. a low thickness of the overall electrode assembly as well as of the individual layers and in particular the functional layer. The varactor can be operated using a low control voltage with only low electrical losses occurring during operation and the varactor can be operated very efficiently.

It is also possible to use a thin ferroelectric layer as a functional layer in order to form a ferroelectric memory cell. Furthermore, the use of the electrode assembly according to the invention as a field-effect transistor represents another possible utilization of the invention that is considered advantageous.

BRIEF DESCRIPTION OF THE DRAWING

An exemplary embodiment of the inventive concept, which is shown by way of example in the FIGURE, will be described in more detail below.

DETAILED DESCRIPTION

The single FIGURE shows an electrode assembly 1 according to the invention. On a surface of a substrate 2 composed of GdScO3, a first electrode 3 is arranged. The first electrode 3 consists of a layer of a first electrode material SrMoO3 which has a perovskite crystal lattice structure. The first electrode 3 has a functional surface 4 with very low surface roughness facing away from the substrate 2. On the functional surface 4 of the first electrode 3, a separation layer 5 only a few nanometers thick composed of SrTiO3 is deposited. The separation layer 5 prevents an oxidation of the first electrode material of the first electrode 3 in the region of the functional surface 4.

On the functional surface 4 of the first electrode 3 which is covered by the separation layer 5, a functional layer 6 composed of Ba0.5Sr0.5TiO3 is arranged. The functional layer 6 accordingly consists of a dielectric material, the dielectric properties of which can be influenced and modified in a targeted manner by applying a suitable control voltage. On the functional layer 6, a second electrode 7 composed of a suitable metal, such as e.g. silver, gold or platinum, is arranged.

Using the electrode assembly 1 illustrated by way of example in the exemplary embodiment, a varactor with particularly advantageous properties is formed. The individual layers of the first electrode 3, the separation layer 5 and the functional layer 6 can be produced using suitable epitaxial methods, so that the individual layers each have ordered crystal lattice structures.

The above-mentioned materials for the individual layers contain elements with properties in terms of the chemical potentials (electronegativity) which, even with very low layer thicknesses, enable a separation of the thermodynamic potentials to be achieved. In addition, these materials are structurally very similar or have a virtually identical crystal structure and thus allow an epitaxial, highly textured deposition of the individual layers one on top of another. The functional unit (first electrode 3, separation layer 5 and functional layer 6) therefore only gives advantageous properties together with an unrestricted functionality of the first electrode layer 3 and the functional layer 6 with a suitable selection and combination of materials, appropriate synthesis conditions and with sufficiently low thicknesses of the separation layer by epitaxy or by a high degree of texturing and predominantly identically oriented grain arrangement of the layers.

The materials mentioned in the exemplary embodiment described above only represent exemplary examples of suitable electrode materials and functional materials. A layer construction of this type with a first electrode material SrMoO3 for the first electrode 3, with a functional layer 6 composed of Ba0.5Sr0.5TiO3 and with any metal electrode for bonding gives a tunable plate capacitor, the capacitance of which can be predetermined using a static bias voltage or control voltage The advantage of using this electrode material comes from the fact that it allows the functional layer 6 to be grown epitaxially, which makes it possible to achieve very thin functional layers and therefore advantageously low control voltages, an orientation of the structure and therefore an advantageous promotion of control and a low defect density in the functional layer and therefore low leakage currents. In comparison, conventional varactors have less advantageous properties because the functional layer is in polycrystalline form.

The separation layer 5 is of crucial importance here. A varactor produced using the same materials for the first electrode 3 and the functional layer 6, but without a suitable separation layer, would not have any significant varactor properties but would behave in either a poorly conducting or an insulating manner. With a separation layer 5 composed of e.g. SrTiO3, varactor according to the invention with advantageous properties can be produced. The deposition conditions for the separation layer 5 which are matched to the adjacent layers enable the electrode material and the functional material to be separated both spatially and functionally, so that the two materials each retain their respective properties.

For the electrode assembly that is illustrated by way of example in the figure, which can be configured and operated as a varactor (varactor 1), a number of relevant properties were measured, which are compared below with data from a data sheet for a commercially available "Parascan™" STPTIC varactor from Paratek Microwave, Inc.:

|  | Parascan ™ | Varactor 1 |
|---|---|---|
| Capacitance | 1.20 pF | 5 pF |
| Leakage current at 20 V | 100 nA | <100 nA |
| Tuning range 2 V to 20 V at 100 kHz | 3.5/1 | 5/1 |
| Quality factor at 900 MHz | 65 | 80 |
| Quality factor at 1800 MHz | 45 | 50 |

It has been shown that the varactor 1 configured according to the invention has better properties for the intended use in each case than a comparable varactor with a conventional construction in which metallic electrodes are combined with a polycrystalline dielectric material. The advantageous properties of the varactor according to the invention are significantly promoted by the oxidic lower electrode 3 with the epitaxially grown dielectric material of the functional layer 6. In this way, compared with conventional varactors a substantially thinner functional layer 6 can be obtained, the capacitance of which can be controlled by applying a voltage to the two electrodes 3 and 7.

A further, second exemplary embodiment corresponds substantially to the exemplary embodiment described above.

Between the work function of the electrode material SrMoO3 and the electron affinity of the functional material Ba0.3Sr0.5TiO1 used for the functional layer 6 there is an electron barrier of about 0.2-0.6 eV. In the second exemplary embodiment, instead of the separation-layer material SrTiO3 the compound SrZrO3 is used for the separation layer 5. SrZrO3 has a significantly higher electron affinity than the functional material Ba0.5Sr0.5TiO3, so that the electron barrier between the electrode 3 and the functional layer 6 is promoted and enhanced by the advantageous choice of the separation-layer material SrZrO3. It has been shown that, against this background, the use of a compound with the empirical formula SrXO3 is advantageous, wherein X is used to denote any selection from or mixture of the elements Ti, Zr or Hf.

A third exemplary embodiment relates to a varactor 1 having an electrode 3 composed of the electrode material SrMoO3, having a separation layer 5 composed of the separation-layer material SrTiO3 and having a functional layer 6 composed of a functional material Ba0.5Sr0.5TiO3. By using an epitaxial production method, the lattice structures of the electrode 3, the separation layer 5 and the functional layer 6 are matched to one another. A functional layer 6 which is less than 100 nm thick and thus very thin can therefore be deposited on the separation layer 5, which nevertheless enables the desired functionality to be achieved. In a varactor 1 produced experimentally according to the third exemplary embodiment, with maximum control voltages of less than 3.5 V, tunabilities of more than 3/1 were achieved, so that the tuning range given in the above table for the first exemplary embodiment is modified not in terms of the notability of 3/1 but particularly in relation to the control voltage of less than 3.5 V that is needed for this, purpose instead of 20 V, and is improved for many applications. Thus, numerous components of electronic, data processing equipment can be supplied with an operating voltage of between 15 V and 5 V, so that a varactor 1 according to the third exemplary embodiment could be used as a tunable part in mobile electronic devices, such as e.g. smartphones or smartwatches, without placing costly separate demands on the operating voltage used in the mobile electronic devices.

The invention claimed is:

1. A microelectronic electrode assembly having a first electrode arranged on a substrate, wherein the first electrode consists of a thin electrode layer composed of a first electrode material, wherein the first electrode material is a compound with the empirical formula A1±xB1±yO3±z or A1+nBn(O1−aNa)3n+1, wherein A is at least one of the elements Ca, Sr or Ba or a mixture of these elements, wherein B is at least one of the elements V, Nb, Ta, Cr, Mo or W or a mixture of these elements and wherein the numerals x, y, and z and a can each assume values of between 0 and 1 and the numeral n can assume values of between 1 and ∞, wherein the first electrode material is oxidizable upon contact with oxygen-containing compounds and comprises a perovskite or perovskite-derived crystal structure and wherein the electrode comprises a functional surface facing away from the substrate, on which functional surface a further layer can be arranged, and having a separation layer composed of a separation-layer material which covers the functional surface of the electrode, wherein the separation layer prevents an oxidation of the electrode material in the region of the functional surface, which oxidation would modify the properties of the electrode, wherein an electrically insulating functional layer is arranged on the separation layer, a second electrode is arranged on the electrically insulating functional layer, the separation layer comprises a separation-layer solid-state lattice and the functional layer comprises a functional-layer solid-state lattice, and a lattice structure of the separation-layer solid-state lattice is matched to a lattice structure of the functional-layer solid-state lattice, such that the functional layer can be deposited epitaxially on the separation layer.

2. The electrode assembly according to claim 1, wherein the electrically insulating functional layer has modifiable dielectric properties.

3. The electrode assembly according to claim 1, wherein the first electrode material is a perovskite oxide, a perovskite ox nitride or a perovskite-based Ruddlesden-Popper structure.

4. The electrode assembly according to claim 1, wherein the electrode material has a resistivity of less than 100 μΩm.

5. The electrode assembly according to claim 1, wherein the first electrode material comprises one of the compounds SrMoO3, SrMoO3-aNa BaMoO3, SrVO3, SrNbO3 or Sr2MoO4.

6. The electrode assembly according to claim 1, wherein the separation layer is a perovskite oxide and comprises a compound with the empirical formula A1±xB1±yO3±z, wherein either A is one of the elements Ca, Sr or Ba or a mixture of these elements and B is one of the elements Ti, Zr or Hf or a mixture of these elements, or wherein A is at least one of the elements La, Pr, Dy, Tb, Sm, Nd or Gd or a mixture of these elements and B is at least one of the elements Sc or Y or a mixture of these elements, and wherein the numerals x, y and z can each assume values of between 0 and 1.

7. The electrode assembly according to claim 6, wherein the separation layer comprises one of the compounds SrTiO3, SrZrO3, DyScO3, GdScO3 or SrHfO3.

8. The electrode assembly according to claim 1, wherein the functional layer comprises a compound with the empirical formula BaxSr1−xTi1±yO3±z, preferably Ba0.5Sr0.5TiO3, wherein the numerals x, y and can each assume values of between 0 and 1.

9. The electrode assembly according to claim 1, wherein a work function of the electrode material and/or an electron affinity of the separation-layer material show a difference which is as great as possible, in particular a difference of more than 0.5 eV relative to an electron affinity of a functional material of the functional layer.

10. The electrode assembly according to claim 1, wherein the electrode assembly forms a varactor.

11. The electrode assembly according to claim 1, wherein the thin electrode layer of the first electrode comprises a thin electrode layer solid-state lattice and the separation layer comprises a separation layer solid-state lattice, wherein a lattice structure of the separation layer solid-state lattice is matched to a lattice structure of the thin electrode layer solid-state lattice, such that the separation layer can be deposited epitaxially on the thin electrode layer.

12. The electrode assembly according to claim 1, wherein the separation layer completely covers a top surface of the electrode layer.

* * * * *